(12) United States Patent
Hoshuyama

(10) Patent No.: US 7,978,799 B2
(45) Date of Patent: *Jul. 12, 2011

(54) ADAPTIVE DIGITAL FILTER, FM RECEIVER, SIGNAL PROCESSING METHOD, AND PROGRAM

(75) Inventor: Osamu Hoshuyama, Tokyo (JP)

(73) Assignee: NEC Corporation, Tokyo (JP)

( * ) Notice: Subject to any disclaimer, the term of this patent is extended or adjusted under 35 U.S.C. 154(b) by 646 days.

This patent is subject to a terminal disclaimer.

(21) Appl. No.: 11/922,042

(22) PCT Filed: Jun. 2, 2006

(86) PCT No.: PCT/JP2006/311058
§ 371 (c)(1),
(2), (4) Date: Dec. 12, 2007

(87) PCT Pub. No.: WO2007/010678
PCT Pub. Date: Jan. 25, 2007

(65) Prior Publication Data
US 2009/0285335 A1  Nov. 19, 2009

(30) Foreign Application Priority Data
Jul. 15, 2005 (JP) .................................. 2005-206719

(51) Int. Cl.
*H04B 1/10* (2006.01)
(52) U.S. Cl. ........ 375/350; 375/347; 375/324; 375/232; 375/233; 375/346
(58) Field of Classification Search .................. 375/350, 375/347, 324, 232, 233, 346
See application file for complete search history.

(56) References Cited

U.S. PATENT DOCUMENTS

| | | | | |
|---|---|---|---|---|
| 4,080,661 A | * | 3/1978 | Niwa ............................. | 708/405 |
| 4,131,766 A | * | 12/1978 | Narasimha ..................... | 370/484 |
| 5,473,280 A | * | 12/1995 | Ohnishi et al. ................ | 329/304 |
| 5,995,565 A | * | 11/1999 | Tong et al. .................... | 375/346 |
| 6,009,448 A | * | 12/1999 | Jong et al. ..................... | 708/322 |

(Continued)

FOREIGN PATENT DOCUMENTS

JP  08-056245  2/1996

(Continued)

OTHER PUBLICATIONS

M. Itami et al., "Trial manufacture of FM multipath distortion canceller," National Convention Record of the Institute of Television Engineers of Japan, 1986, pp. 355-356.

(Continued)

*Primary Examiner* — Kenneth Lam
(74) *Attorney, Agent, or Firm* — Foley & Lardner LLP (57) ABSTRACT

A complex signal in which one of two signals that have been generated from a single real signal and that have phases that are shifted 90° with respect to each other is a real part and the other signal is an imaginary part is applied as input to an input terminal. A filter unit generates an output signal that is a complex signal by means of a convolution operation of the input signal, and a filter coefficient that is a real signal and supplies this output signal to an output terminal. A coefficient control unit made up from a common unit and separate units updates the filter coefficients such that the value of the envelope of the output signal approaches a target signal.

6 Claims, 7 Drawing Sheets

U.S. PATENT DOCUMENTS

| | | |
|---|---|---|
| 6,621,863 B1 | 9/2003 | Ido |
| 7,155,245 B2 | 12/2006 | Yamamoto et al. |
| 2001/0016004 A1* | 8/2001 | Kim .............................. 375/233 |
| 2004/0146095 A1 | 7/2004 | Umeno et al. |
| 2004/0193965 A1* | 9/2004 | Coersmeier ..................... 714/48 |
| 2005/0053177 A1* | 3/2005 | Yamamoto et al. ............ 375/350 |
| 2009/0122931 A1* | 5/2009 | Hoshuyama ................... 375/350 |
| 2009/0122932 A1* | 5/2009 | Hoshuyama ................... 375/350 |
| 2009/0207955 A1* | 8/2009 | Hoshuyama et al. .......... 375/346 |

FOREIGN PATENT DOCUMENTS

| | | |
|---|---|---|
| JP | 09-162783 | 6/1997 |
| JP | 2000-286763 A | 10/2000 |
| JP | 2002-280941 A | 9/2002 |
| JP | 2003-115819 A | 4/2003 |
| JP | 2003-248673 A | 9/2003 |
| JP | 2005-064618 A | 3/2005 |

OTHER PUBLICATIONS

C.R. Johnson et al., "Blind Equalization Using the Constant Modulus Criterion: A review," Proceedings of IEEE, vol. 86:10, Oct. 1998, pp. 1927-1950.

J.R. Treichler et al., A new approach to multipath correction of constant modulus signals, IEEE Transactions of Acoustics, Speech, and Signal Processing, vol. 31:2, pp. 459-472, Apr. 1983.

* cited by examiner

ADAPTIVE DIGITAL FILTER, FM RECEIVER, SIGNAL PROCESSING METHOD, AND PROGRAM

This application is the National Phase of PCT/JP2006/311058, filed Jun. 2, 2006, which claims priority to Japanese Application No. 2005-206719, filed Jul. 15, 2005, the disclosures of which are hereby incorporated by reference in their entirety.

TECHNICAL FIELD

The present invention relates to an adaptive digital filter, and more particularly, to an adaptive digital filter suitable for use in devices such as the multipath equalizer of an FM (Frequency Modulation) receiver.

BACKGROUND ART

FM modulated waves used in FM radio broadcasting and television broadcasting are signals in which a sine wave carrier signal is subjected to phase modulation by a music signal. FM modulated waves have high resistance against noise and can transmit music signals having a broadband of 15 kHz with a low distortion factor.

However, in multipath propagation paths, which include paths other than the path by which a radio wave arrives directly and in which radio waves are reflected by obstructions such as buildings and thus arrive with a delay, the phase information required for demodulation is disturbed by the influence of strong reflected waves that are received together with direct waves, and distortion therefore occurs in the demodulated signal. This distortion that is produced as a result of multipath propagation paths is referred to as "multipath distortion." An equalizer for reducing multipath distortion by correcting the characteristics of multipath propagation paths is referred to as a "multipath equalizer" or a "multipath distortion canceller."

A multipath equalizer compensates for the effect of multi-paths in a received signal by passing the received signal through a filter having the inverse characteristics of the multipath propagation paths, i.e., an inverse filter. The characteristics of the multipath propagation paths change according to the environment, and the characteristics of the inverse filter therefore must also be optimized according to the conditions over time. As a result, adaptive digital filters are typically used as inverse filters.

An adaptive digital filter is a filter having the capability for automatically updating the filter coefficient according to changes in the environment. An algorithm for calculating filter coefficients at each point in time is referred to as an "adaptive algorithm," an LMS (Least Mean Square) algorithm being a representative example. In a broad sense, an LMS algorithm is a method of minimizing the root-mean-square error based on a steepest-descent method and offers the advantages of stability and a small amount of operations.

Adaptive algorithms known as complex LMS algorithm are also known. A complex LMS algorithm is an extension of the LMS algorithm in which each of the input signal, output signal, target signal, and filter coefficients are complex amounts, and is used, for example, when adapting reference signal by separating the in-phase component and quadrature component when the input is a narrow-band high-frequency signal.

On the other hand, a conventional equalizer that is realized by an adaptive digital filter requires a reference signal (training signal) for this adaptation, and this requirement tends to cause an interruption in communication and a reduction of communication efficiency due to redundant reference signals.

In contrast, a recently developed equalizer known as the "blind equalizer" performs restorative equalization of signals based only on the received signals without requiring a reference signal for adaptation. An algorithm for application in this type of blind equalization is called a "blind algorithm," a CMA (Constant Modulus Algorithm) being a representative example.

As shown in Non-Patent Document 1, CMA typically refers to an algorithm in which a statistic relating to the output signal such as the envelope of the filter output or a higher-order statistic is taken as an index, the algorithm updating filter coefficients such that this index approaches a target value. When using a constant-amplitude modulated wave in which the amplitude of the modulated wave is fixed as in FM modulation, the envelope of the filter output, i.e., amplitude, is used as the index and the filter coefficients are updated to minimize the error between a target value and the value of the envelope of the signal following passage through the filter, as shown in Non-Patent Document 2. In this way, distortion of phase is also corrected together with the distortion of the envelope, and the influence of reflected waves of multipath propagation paths is eliminated.

Here, CMA is a different concept than an adaptive algorithm. In CMA, an adaptive algorithm such as the previously mentioned LMS algorithm is used as an adaptive algorithm for calculating filter coefficients at each time point.

In order to uniformly control the value of the envelope of the output signal of a filter as previously described, the value of the envelope must be extracted instantaneously, and complex signal processing is a representative method of this type of extraction. In complex signal processing, a real signal f2 having phase that is delayed 90° ($\pi/2$) with respect to a particular real signal f1 is generated by, for example, a Hilbert transformer, and a complex signal (typically referred to as an "analytic signal") having f1 in a real part and f2 in an imaginary part is generated. In this way, the value of the envelope of this real signal can be found instantaneously by calculating the square sum of the real part and imaginary part of the complex signal. However, when the output signal of the filter is subjected to complex signal processing, delay caused by the complex signal processing enters into the coefficient update loop and gives rise to instability of the loop. As a result, the complex signal processing is carried out on the input signal. In such cases, the input signal becomes a complex signal, and an algorithm that can handle complex quantities such as a complex LMS algorithm is therefore used as the adaptive algorithm. This method is referred to as the "first technique of the related art."

Figure 1:
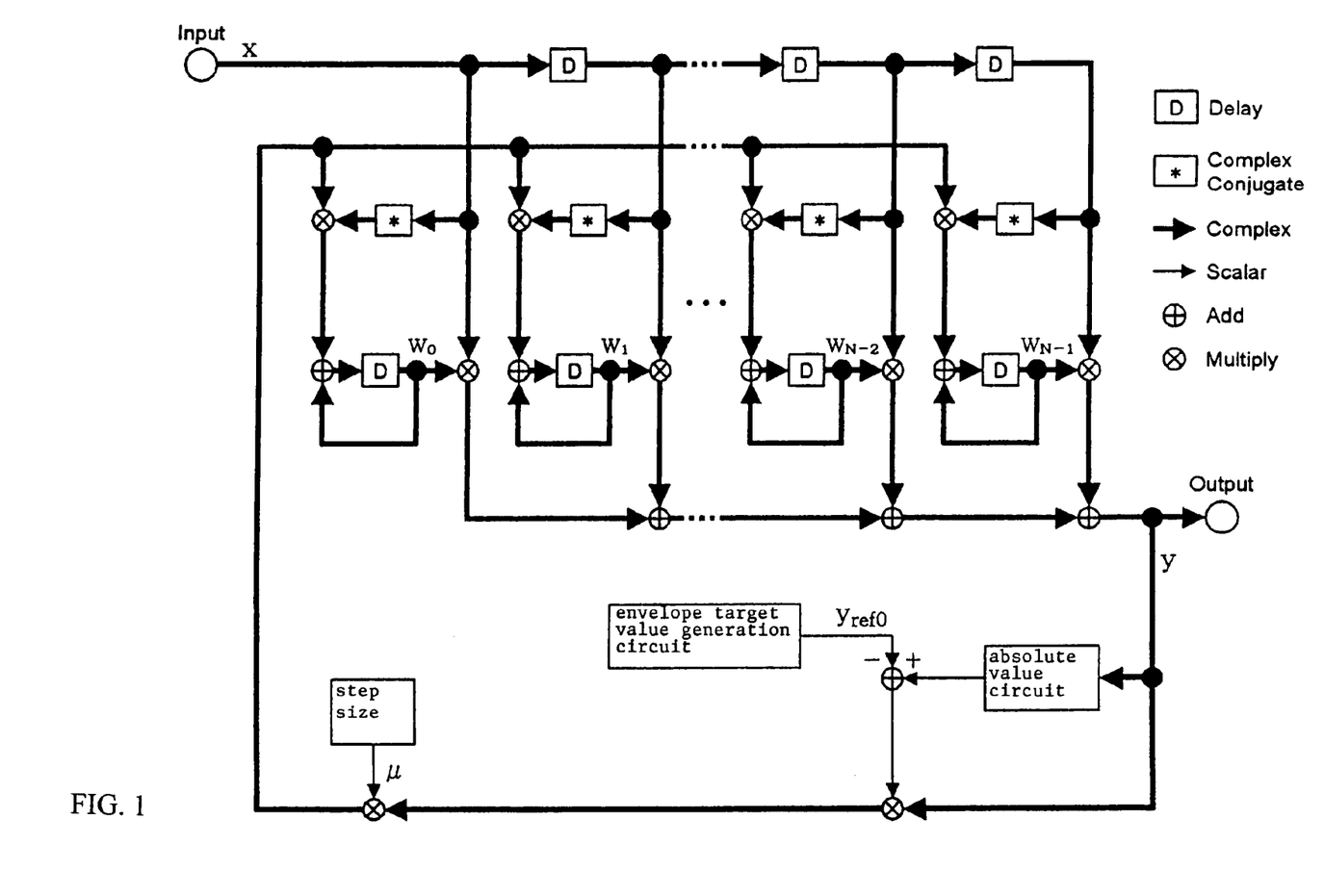
FIG. 1 is a block diagram showing the configuration of the adaptive digital filter according to the first technique of the related art.

FIG. 1 shows the configuration of an adaptive digital filter that uses the first technique of the related art.

Referring to FIG. 1, input signal X(k) has been converted to a complex signal by a Hilbert transformer (not shown). Complex filter coefficient vector W(k) is convoluted by this complex signal as input to obtain output signal y(k), which is a complex signal. Complex filter coefficient vector W(k) is updated by an adaptive algorithm that has been expanded to handle complex signals such that the value of the envelope of output signal y(k) approaches a target value that has been prescribed in advance. The algorithm of this adaptive digital filter is represented as shown below:

$$W(k+1)=W(k)-\mu(|y(k)|p-\text{yref0})qy(k)XH(k) \quad (1)$$

$$y(k)=WT(k)X(k) \quad (2)$$

$$W(k)=[w0(k),w1(k),\ldots,wN-1(k)]T \quad (3)$$

$$X(k)=[x(k),x(k-1),\ldots,x(k-N+1)]T \quad (4)$$

where W(k) represents a filter coefficient vector, X(k) represents a complex signal vector, k represents a sample index, N represents the number of filter taps, y(k) represents the output signal, yref0 represents the envelope target value, and μ represents a parameter for determining the amount of update of the filter coefficients. In addition, H represents a complex conjugate transposition, and T represents a transposition. The values p and q are constants for determining an evaluation function of error for the envelope target value, and for example, may be p=1 and q=1.

In the first technique of the related art, two signals having phases that are shifted 90° (π/2) with respect to each other are generated by applying complex signal processing. However, as can be seen from Patent Document 1 and Non-Patent Document 3, if sampling is carried out at a frequency of (4/odd number) times the carrier frequency when sampling the input signal, the phases of adjacent sample points will be shifted 90°. By taking this approach, an adaptive algorithm for handling real numbers can be used as is, whereby the square sum of adjacent sample points can be calculated when seeking the value of the envelope of the output signal. This method is referred to as the "second technique of the related art."

Figure 2:
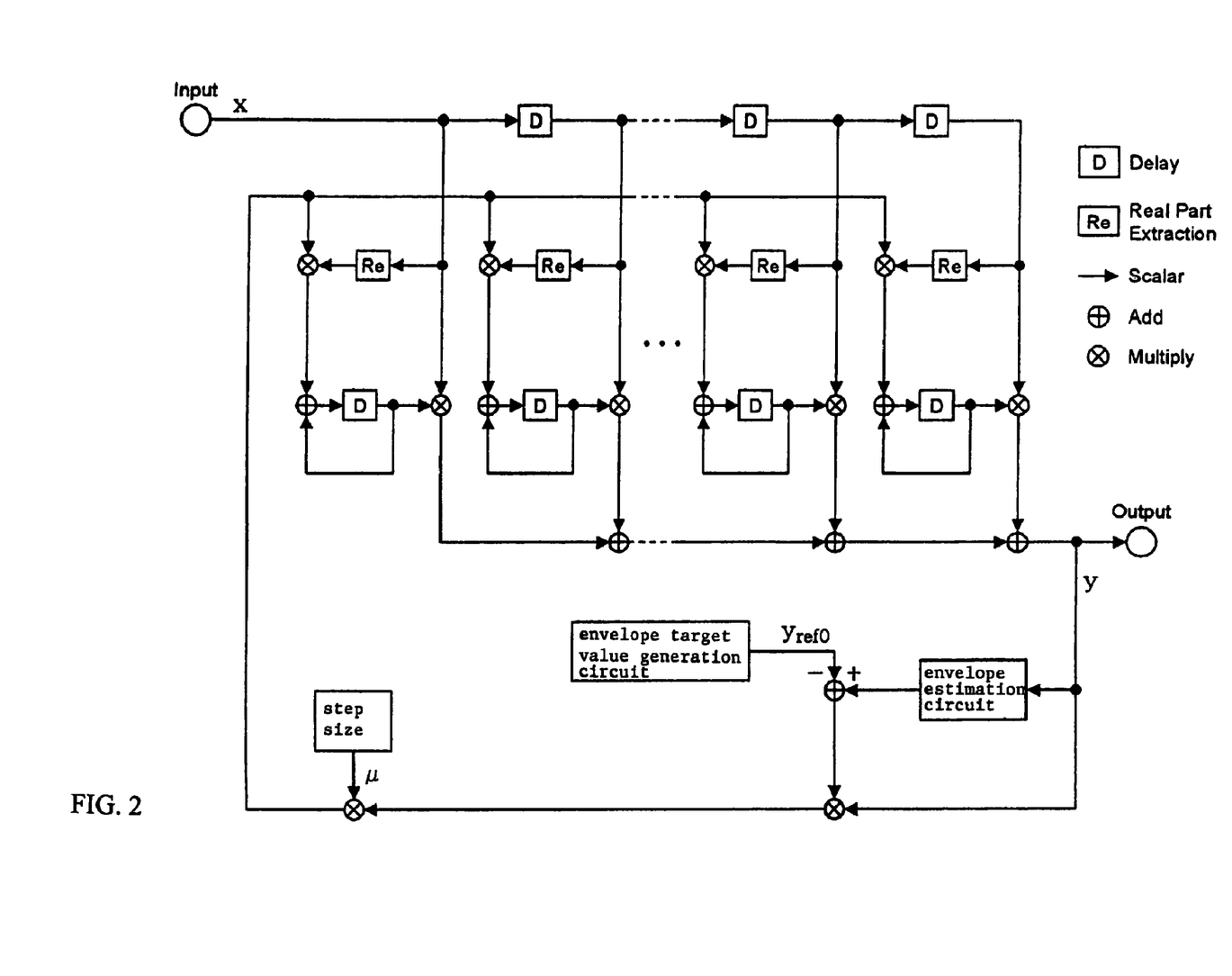
FIG. 2 is a block diagram showing the configuration of the adaptive digital filter according to the second technique of the related art.

FIG. 2 shows the configuration of an adaptive digital filter that uses the second technique of the related art.

Referring to FIG. 2, input signal Xr(k) is a real signal, and the real-signal filter coefficient vector Wr(k) is convoluted by this real signal as input to obtain real-signal output signal yr(k). Filter coefficient vector Wr(k) is updated by an adaptive algorithm that handles real coefficients such that the envelope of output signal yr(k) approaches a target value that has been prescribed in advance. This adaptive digital filter algorithm is represented as shown below:

$$Wr(k+1)=Wr(k)-\mu(Env[yr(k)]-\text{yref0})yr(k)Xr(k) \quad (5)$$

$$yr(k)=WrT(k)Xr(k) \quad (6)$$

$$Env[yr(k)]=(yr2(k-1)+yr2(k))1/2 \quad (7)$$

$$Wr(k)=Re[W(k)] \quad (8)$$

$$Xr(k)=Re[X(k)] \quad (9)$$

where Wr(k) represents a real coefficient vector, Xr(k) represents a real signal vector, Env[ ] represents an operation for obtaining an approximate value of the envelope, Re[ ] represents an operation for taking the real part of the complex number, and yr(k) represents a real-number output signal.

However, in the adaptive digital filter shown in FIG. 1, nearly all signal processing, for example, for input signal X(k), filter coefficient vector W(k), and output signal y(k), is carried out by complex numbers. A single multiplication of complex numbers corresponds to four multiplications and two additions of real numbers. In a multipath equalizer for an FM receiver, convolution operations and coefficient updating operations of most filters having many taps must be executed for each short sampling period, and this raises the problem of a voluminous amount of operations.

In the adaptive digital filter shown in FIG. 2, on the other hand, if the sampling frequency is precisely (4/odd number) times the center frequency of an intermediate-frequency signal, the calculation accuracy of the envelope can be increased, the same performance as the adaptive digital filter of FIG. 1 can be obtained, and moreover, the operation load can be reduced to approximately 25%. Nevertheless, this technique suffers from the problems that the sampling frequency is subject to strict limits and design for any sampling frequency is not possible. If the sampling frequency is shifted from (4/odd number) times the center frequency of an intermediate frequency signal, the accuracy of calculating the envelope drops and the multipath equalization capabilities therefore deteriorate.

Patent Document 1: JP-A-2005-064618

Non-Patent Document 1: C. Richard Johnson, Jr., Philip Schniter, Thomas J. Endres, James D. Behm, Donald R. Brown, and Raul A. Casas, "Blind Equalization Using the Constant Modulus Criterion: A Review," Proceedings of IEEE, Vol. 86, No. 10, October 1998.

Non-Patent Document 2: J. R. Treichler and B. G. Agee, "A New Approach to Multipath Correction of Constant Modulus Signals," IEEE Transactions on Acoustics, Speech, and Signal Processing, Vol. 31, No. 2, pp. 459-472, April 1983.

Non-Patent Document 3: Itami Makoto, Hatori Mitsutoshi, Tsukamoto Norio, "Hardware Implementation of FM Multipath Distortion Canceller," National Convention Record of the Institute of Television Engineers of Japan, No. 22, pp. 355-356, 1986.

DISCLOSURE OF THE INVENTION

The present invention was proposed in view of these circumstances and has as its object the provision of an adaptive digital filter that places no limits on sampling frequency and that can reduce the amount of operations.

The first adaptive digital filter of the present invention is provided with: a filter unit that takes a complex signal as an input signal and that generates and supplies as output an output signal that is a complex signal generated by performing a convolution operation of the input signal vector and a filter coefficient vector that is a real signal; and a coefficient control unit for controlling the filter coefficients based on the error between a target signal and an index value derived from the output signal.

According to the second adaptive digital filter of the present invention, the filter unit in the first adaptive digital filter takes as the input signal a complex signal in which one of two signals that have been generated from one real signal and that have phases that are shifted 90° with respect to each other is a real part and the other signal is an imaginary part.

According to the third adaptive digital filter of the present invention, the coefficient control unit in the first adaptive digital filter takes the value of the envelope of the output signal as the index value.

According to the fourth adaptive digital filter of the present invention, the coefficient control unit in the first adaptive digital filter includes: a common unit for generating and supplying as output a real signal that agrees with error between the index value and the target signal; and a plurality of separate units provided for each multiplier for the convolution operation in the filter unit for calculating the real filter coefficients to be used in the next sampling cycle based on: a signal obtained by converting a complex signal to a real number that is applied as input to a corresponding multiplier, the real signal received as input from the common unit, and the current real filter coefficients.

The FM receiver of the present invention is provided with: a first adaptive digital filter, and a Hilbert transformer for applying as input to the adaptive digital filter a complex signal generated by converting an FM modulated signal to an intermediate frequency and digitizing and then subjecting the signal to Hilbert transformation.

The first signal processing method of the present invention includes steps of: (a) taking a complex signal as an input signal and then supplying an output signal that is a complex signal generated by performing a convolution operation of the input signal vector and a filter coefficient vector that is a real number; and (b) controlling the filter coefficients based on error between a target signal and an index value derived from the output signal.

According to the second signal processing method of the present invention, in step (a) in the first signal processing method, the input signal is a complex signal having one of two signals that have been generated from one real signal and that have phases that are shifted 90° with respect to each other as a real part and the other signal as an imaginary part.

According to the third signal processing method of the present invention, in step (b) of the first signal processing method, the value of the envelope of the output signal is taken as the index value.

The fourth signal processing method of the present invention includes, in step (b) of the first signal processing method, a common process for generating a real signal that agrees with the error between the index value and the target signal; and in step (a), a plurality of separate processes that are carried out for each multiplier for the convolution operation for calculating real filter coefficients to be used in the next sampling cycle based on: a signal obtained by converting a complex signal to a real number that is applied as input to the corresponding multiplier, the real signal that was generated in the common process, and the current real filter coefficients.

In the present invention, the filter coefficients are real signals, but the input signal is a complex signal in which one of two signals that have phases that are shifted 90° with respect to each other is a real part and the other signal is an imaginary part. As a result, the output signal generated by the convolution operation of the input signal and the filter coefficients also is a complex signal in which one of two signals that have phases that are shifted 90° with respect to each other is a real part and the other signal is an imaginary part. The value of the envelope of the output signal can therefore be instantaneously and accurately found, as in the first technique of the related art, and further, no limitations are placed on the sampling frequency as in the second technique of the related art. In addition, the operation load can be greatly reduced by making the filter coefficients real numbers. Further, the real part and imaginary part of the complex signal that is the input signal only have phases that are shifted 90° with respect to each other, are originally generated from the same single real signal, and have been converted to a complex signal only to enable instantaneous calculation of an index value such as the value of the envelope of the output signal. As a result, the filter performance as an adaptive digital filter does not suffer by comparison with the first technique of the related art for handling a real part and imaginary part of an input signal or with the second technique of the related art for handling only the real part (or imaginary part) of an input signal.

BEST MODE FOR CARRYING OUT THE INVENTION

Explanation next regards an embodiment of the present invention with reference to the accompanying figures.

Figure 3:
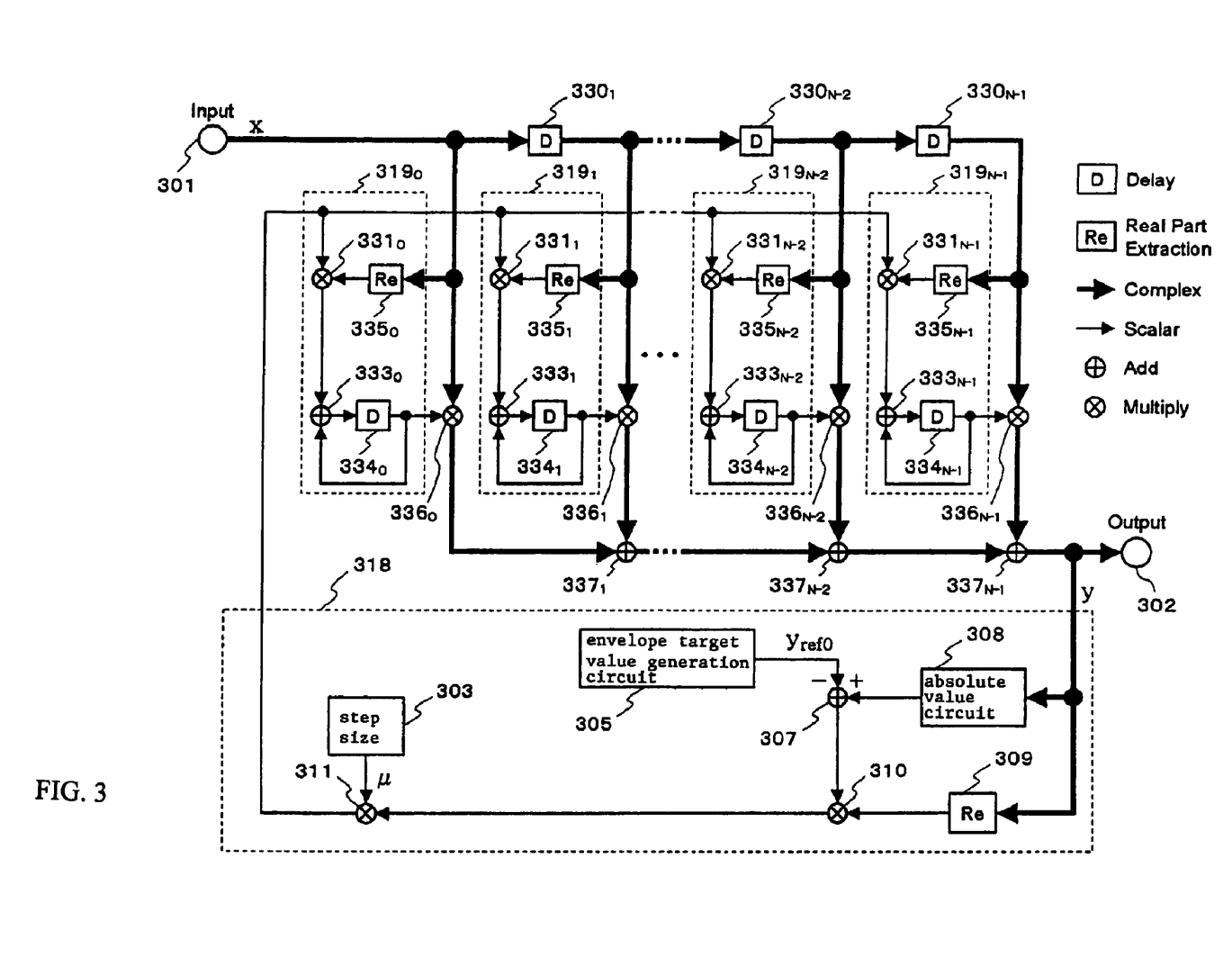
FIG. 3 is a block diagram showing the configuration of the adaptive digital filter according to an embodiment of the present invention.

Referring to FIG. 3, the adaptive digital filter according to an embodiment of the present invention is provided with: a filter unit for generating an output signal that is a complex signal (complex output signal) by performing a convolution operation of a complex signal (complex input signal) that is applied to input terminal 301 and a filter coefficient vector that is a real signal (real filter coefficients) and supplying the complex output signal to output terminal 302; and a coefficient control unit for controlling filter coefficients based on the error between an index value derived from the complex output signal (the value of the envelope in the case of the present embodiment) and a target signal. The coefficient control unit is the portion composed of one block (common unit 318 to be explained hereinbelow) and N blocks (separate units $319_0$-$319_{N-1}$ to be explained hereinbelow) in the figure, and the other parts make up the filter unit. Here, the complex input signal is a complex signal in which one of two signals that have been generated from a single real signal and that have phases that are shifted 90° with respect to each other is a real part and the other is an imaginary part.

The filter unit is an FIR (Finite Impulse Response) filter having a tap number of N, i.e., having N filter coefficients. This filter unit is made up from: tapped delay lines composed of N−1 delay units $330_1$-$330_{N-1}$ that each give a delay of one sampling cycle, N multipliers $336_0$-$336_{N-1}$ for multiplying the complex input signal and the output signals of each of delay units $330_1$-$330_{N-1}$ with a filter coefficient vector; and N−1 adders $337_1$-$337_{N-1}$ for successively adding the results of multiplication of these N multipliers $336_0$-$336_{N-1}$.

The coefficient control unit uses LMS as an adaptive algorithm and is made up from: common unit 318 that is common to the control of all filter coefficients, and separate units $319_0$-$319_{N-1}$ for the control of each individual filter coefficient.

Common unit 318 is composed of: absolute value circuit 308 that receives as input a complex output signal that is the output of the filter unit and that calculates and supplies the value of the envelope of the complex output signal by the square sum of the real part and the imaginary part; envelope target value generation circuit 305 for generating a value with which the envelope is to converge, i.e., the envelope target value; subtractor 307 for supplying a value obtained by subtracting the envelope target value from the value of the envelope found in absolute value circuit 308; real-part extraction circuit 309 for receiving as input the complex output signal and extracting and supplying only the real part of this signal;

multiplier 310 for supplying the result of multiplying the output of subtractor 307 and the output of real part extraction circuit 309; step-size generation circuit 303 for generating a step size, which is a parameter for determining the update amount of filter coefficients; and multiplier 311 for supplying the result of multiplying the output of multiplier 310 and the step size to each of separate units $319_0$-$319_{N-1}$.

In the present embodiment, the filter coefficients are real numbers and not complex numbers, whereby the step size generated at step-size generation circuit 303 is set to approximately 4 times the step size for a case in which complex filter coefficients are used. As a result, the convergence speed can be made equivalent to a case of using complex filter coefficients.

In addition, each of separate units $319_0$-$319_{N-1}$ is made up from: real part extraction circuits $335_0$-$335_{N-1}$ for receiving as input a complex input signal or the output signal of a corresponding delay unit $330_1$-$330_{N-1}$ on the tapped delay line and for extracting and supplying only the real part of these complex signals; multipliers $331_0$-$331_{N-1}$ for supplying the results of multiplying the signal received as input from common unit 318 with the real parts extracted by real part extraction circuits $335_0$-$335_{N-1}$; adders $333_0$-$333_{N-1}$ for adding the filter coefficients that are applied to multipliers $336_0$-$336_{N-1}$ to the outputs of multiplier $331_0$-$331_{N-1}$ and supplying the filter coefficients to be used in the next sampling cycle; and delay units $334_0$-$334_{N-1}$ for delaying the outputs of these adders $333_0$-$333_{N-1}$ by exactly one sampling cycle and supplying the result to multipliers $336_0$-$336_{N-1}$.

The algorithm of the adaptive digital filter of the present embodiment is represented as shown below:

$$Wr(k+1)=Wr(k)-\mu(|y(k)|p-yref0)qRe[y(k)]Re[X(k)] \qquad (10)$$

$$y(k)=WrT(k)X(k) \qquad (11)$$

where Wr(k) is a real coefficient vector, X(k) is a complex signal vector, Re[ ] is an operation for extracting the real part of a complex number, y(k) is a complex output signal, k is a sampling index, yref0 is the envelope target value, and μ is a parameter for determining the update amount of filter coefficients. The values p and q are constants for determining evaluation functions of errors with respect to the envelope target value, and for example, are made p=1 and q=1.

Explanation next regards the operation of the adaptive digital filter of the present embodiment.

Figure 4:
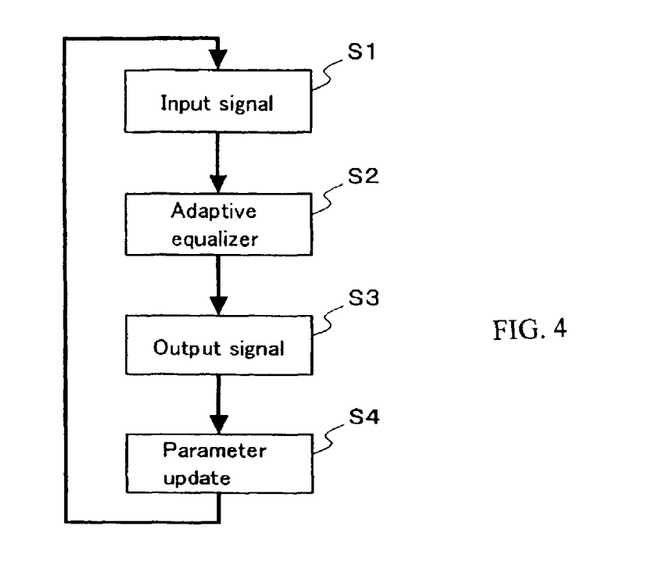
FIG. 4 is a flow chart for explaining the operation of the adaptive digital filter according to an embodiment of the present invention.

FIG. 4 is a flow chart for explaining the operation of the adaptive digital filter of the present embodiment.

Referring to FIG. 4, input process S1 of a new complex input signal from input terminal 301, adaptive equalizing process S2, output process S3 of a complex output signal to output terminal 302, and parameter update process S4 are repeated. Adaptive equalizing process S2 is a process based on the above-described equation (11), and parameter updating process S4 is a process based on the above-described equation (10). Explanation next regards the details of each operation.

Explanation first regards adaptive equalizing process S2.

The complex input signal that is applied as input to input terminal 301 is supplied to multiplier $336_0$ and real part extraction circuit $335_0$, and at the same time, supplied to the tapped delay line that is made up from delay units $330_1$-$330_{N-1}$ that produce the delay of one sampling cycle. The complex signal that is supplied to delay units $330_1$-$330_{N-1}$ is transmitted to adjacent delay units with each clock, and the output signals of each of delay units $330_1$-$330_{N-1}$ is supplied to corresponding multipliers $336_1$-$336_{N-1}$ and corresponding real part extraction circuits $335_1$-$335_{N-1}$.

In multiplier $336_0$, the real filter coefficient supplied from delay unit $334_0$ is multiplied by the complex signal that is received as input from input terminal 301, and the result is supplied to adder $337_1$. In multipliers $336_1$-$336_{N-1}$, the real filter coefficients supplied from corresponding delay units $334_1$-$334_{N-1}$ are multiplied by the complex signals supplied from corresponding delay units $330_1$-$330_{N-1}$, and the results are supplied to adders $337_1$-$337_{N-1}$. Adders $337_1$-$337_{N-1}$ add all complex signals received from multipliers $336_0$-$336_{N-1}$, supply the results to output terminal 302, and at the same time, supply the results to absolute value circuit 308 and real-part extraction circuit 309. An output signal that is a complex signal is generated by performing a convolution operation of the complex input signal and a filter coefficient vector that is a real signal and then supplied.

Explanation next regards parameter update process S4.

Absolute value circuit 308 receives the complex output signal, calculates the absolute value of this complex output signal, and transmits the result to subtractor 307 as the value of the envelope. Envelope target value generation circuit 305 generates an envelope target value and transmits this value to subtractor 307. Subtractor 307 subtracts the envelope target value received from envelope target value generation circuit 305 from the signal received from absolute value circuit 308 and transmits the result to multiplier 310. Real-part extraction circuit 309 receives the complex output signal, extracts only the real part of this complex output signal, and transmits the result to multiplier 310. Multiplier 310 multiplies the signal received from real-part extraction circuit 309 by the signal received from subtractor 307 and transmits the result to multiplier 311. Step-size generation circuit 303 generates a step size, which is a parameter for determining the amount of filter coefficient update in the filter unit, and supplies the step size to multiplier 311. Multiplier 311 multiplies the step size supplied from step-size generation circuit 303 by the signal received from multiplier 310 and transmits the result to each of separate units $319_0$-$319_{N-1}$.

In each of separate units $319_0$-$319_{N-1}$, the signal supplied from multiplier 311 is transmitted to multipliers $331_0$-$331_{N-1}$. Each of real-part extraction circuits $335_0$-$335_{N-1}$ extracts the real part of the complex signal supplied from corresponding delay units $330_1$-$330_{N-1}$ or input terminal 301 and transmits the result to corresponding multipliers $331_0$-$331_{N-1}$. Each of multipliers $331_0$-$331_{N-1}$ multiplies the real-number signal supplied from common unit 318 with the real-number signal supplied from corresponding real-part extraction circuits $335_0$-$335_{N-1}$ and transmits the result to corresponding adders $333_0$-$333_{N-1}$. Each of adders $333_0$-$333_{N-1}$ adds the real-number filter coefficient supplied from corresponding delay units $334_0$-$334_{N-1}$ to the real-number signals received from corresponding multipliers $331_0$-$331_{N-1}$ and transmits the result to corresponding delay units $334_0$-$334_{N-1}$ as the filter coefficient of the next sample. Each of delay units $334_0$-$334_{N-1}$ delays by one sample the real-number filter coefficient received from corresponding adders $333_0$-$333_{N-1}$ and both supplies the result to corresponding multipliers $336_0$-$336_{N-1}$ and transmits the result to corresponding adders $333_0$-$333_{N-1}$.

Explanation next regards the effects of the present embodiment.

As can be seen from FIG. 3, most of the signals in adaptive digital filter of the present embodiment are real numbers and not complex numbers. Because the signals are real numbers and not complex numbers, the amount of operations can be greatly reduced compared to the first technique of the related art shown in FIG. 1. This is because all signals are complex numbers in the adaptive digital filter according to the first technique of the related art and multiplication is therefore carried out between complex numbers in all multipliers, while in the present embodiment, multiplication is carried out for a complex number and a real number in multipliers $336_0$-$336_{N-1}$ and between real numbers in multipliers $331_0$-$331_{N-1}$. Multiplication between complex numbers is equivalent to four multiplications between real numbers and two additions between real numbers, while multiplication between a complex number and a real number is equivalent to only two multiplications between real numbers. Further, a multiplication between real numbers is equivalent to only a single multiplication between real numbers.

Accordingly, replacing points in the first technique of the related art in which multiplication is carried out between complex numbers with multipliers $336_0$-$336_{N-1}$ that carry out multiplication between a complex number and a real number eliminates operations equivalent to N instances of multiplication between real numbers. Further, replacing points in the first technique of the related art in which multiplication is carried out between complex numbers with multipliers $331_0$-$331_{N-1}$ that carry out multiplication between real numbers eliminates operations equivalent to 3N instances of multiplication between real numbers and 2N instances of addition between real numbers. Still further, the portion of real-part extraction circuits $335_0$-$335_{N-1}$ requires complex conjugate units in the first technique of the related art, whereby the amount of calculations is reduced by the extent of transmitted code of the imaginary number part.

As described hereinabove, the present embodiment can reduce the amount of operations to approximately 40% of the first technique of the related art.

In addition, in the present embodiment, the output signal of the filter unit is obtained as a complex number, whereby the value of the envelope of the output signal, i.e., the amplitude, is obtained both instantaneously and accurately as the output signal of absolute value circuit 308 of FIG. 3. Accordingly, the present embodiment is not subject to the sampling frequency limitations as in the second technique of the related art.

Figure 5:
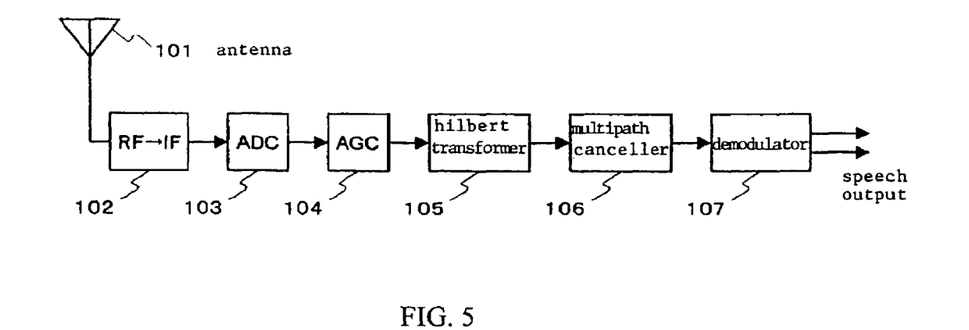
FIG. 5 is a block diagram showing the configuration of the FM receiver according to an embodiment of the present invention.

Referring to FIG. 5, the FM receiver according to the present embodiment is made up from: antenna 101, radio frequency/intermediate frequency converter 102, analog/digital converter 103, automatic gain controller 104, Hilbert transformer 105, multipath canceller 106, and demodulator 107. The adaptive digital filter of the first embodiment is used as multipath canceller 106.

FM modulated waves received at antenna 101 are converted to a signal of an intermediate frequency band in radio frequency/intermediate frequency converter 102 and then transmitted to analog/digital converter 103.

Analog/digital converter 103 samples the analog signal transmitted from radio frequency/intermediate frequency converter 102 at an appropriate sampling frequency to convert it to a digital signal and transmits the result to automatic gain controller 104.

Automatic gain controller 104 transmits to Hilbert transformer 105 the result of multiplying gain such that the amplitude of an output signal is within a range that does not adversely affect the CMA algorithm that takes the envelope value as an index converges within a fixed range.

Hilbert transformer 105 converts the signal transmitted from automatic gain controller 104 to an analytic signal, i.e., a complex signal in which one of two signals that have phases that are shifted 90° with respect to each other is a real part and the other signal is the imaginary part, and transmits this complex signal to multipath canceller 106.

Multipath canceller 106 receives the complex input signal transmitted from Hilbert transformer 105, converts it to a signal in which the effect of multiple reflection is reduced by an operation such as was explained with reference to FIG. 3, and transmits the result to demodulator 107. A complex output signal is supplied from output terminal 302 of the adaptive digital filter of FIG. 3, but only the real part of this complex output signal is extracted and supplied to demodulator 107, or only the imaginary part of this complex output signal is extracted, the code inverted, and then supplied to demodulator 107.

Demodulator 107 performs FM demodulation upon the signal transmitted from multipath canceller 106 and supplies a signal of the speech frequency band.

Although the above explanation regards an embodiment of the present invention, the present invention is not limited to only the above embodiment and allows various alterations as described hereinbelow.

Figure 6:
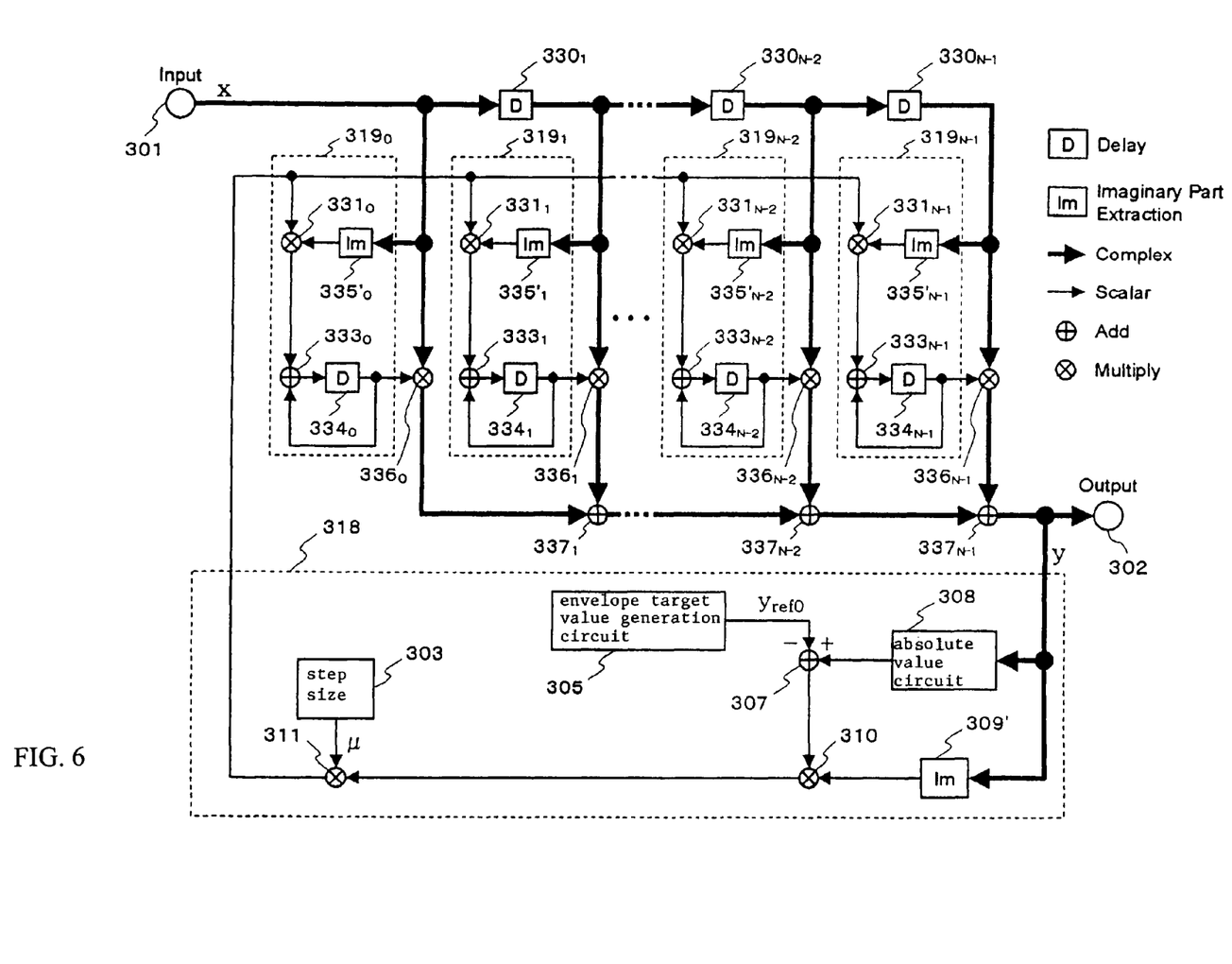
FIG. 6 is a block diagram showing the configuration of a modification of the adaptive digital filter according to an embodiment of the present invention.

Although real-part extraction circuits $335_0$-$335_{N-1}$ and real-part extraction circuit 309 were used in the present embodiment, all or a portion of these circuits may be replaced by imaginary-part extraction inversion circuits $335'_0$-$335'_{N-1}$ and 309' as shown in FIG. 6. An imaginary-part extraction inversion circuit is a circuit for extracting only the imaginary part of a complex signal that has been received as input and supplying a value in which the code of this imaginary part has been inverted. The complex input signal applied to input terminal 301 of the adaptive digital filter of the present embodiment is a signal in which one of two signals that have been generated from a single real signal and that have phases that are shifted 90° with respect to each other is a real part and the other signal is an imaginary part, and the same effect can be obtained with the use of an imaginary-part extraction inversion circuit.

Figure 7:
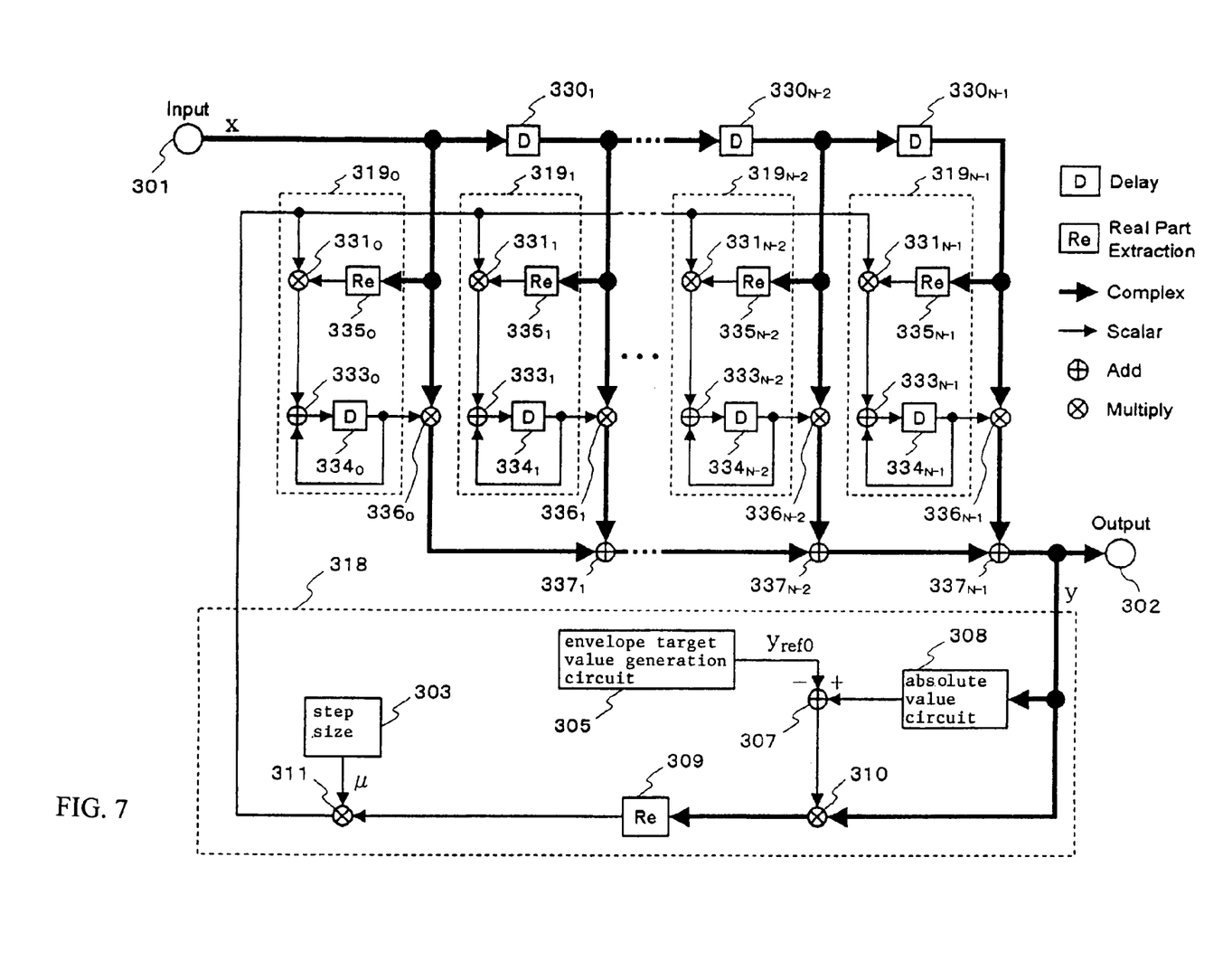
FIG. 7 is a block diagram showing the configuration of a modification of the adaptive digital filter according to an embodiment of the present invention.
Figure 8:
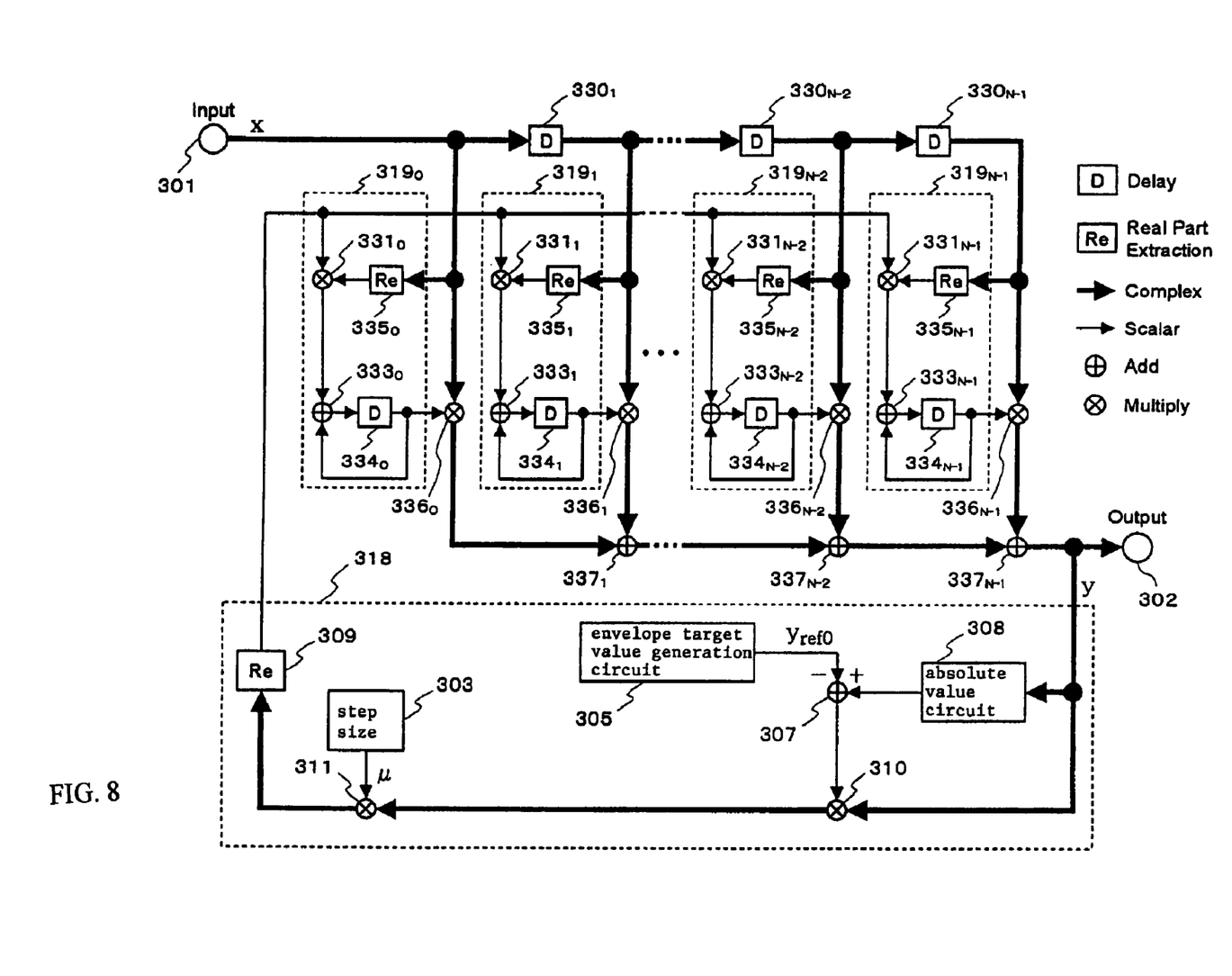
FIG. 8 is a block diagram showing the configuration of a modification of the adaptive digital filter according to an embodiment of the present invention.

Although the filter coefficients in the present embodiment are all real numbers, i.e., scalar values, a portion of the filter coefficients can be made complex numbers, although this alteration reduces the effect of decreasing the amount of operations. Alternatively, real-part extraction circuit 309 may be shifted to the output side of multiplier 310 as shown in FIG. 7 or shifted to the output side of multiplier 311 as shown in FIG. 8 and operations then carried out by complex numbers in multipliers 310 and 311.

Although an FIR filter was used as the filter unit in the present embodiment, an IIR filter can also be used.

In the present embodiment, an LMS algorithm was used as the adaptive algorithm, but various other adaptive algorithms can also be used, such as a recursive least squares algorithm, a least squares algorithm, an affine projection algorithm, and a gradient algorithm. When the number of multiplications when updating filter coefficients by means of these adaptive algorithms is greater than for an LMS algorithm, the effect of reducing the amount of operations realized by converting filter coefficients to real numbers can be augmented.

Although FM modulation was taken as the object in the present embodiment, the configuration of the present invention can obviously also be applied to another constant-amplitude modulation such as PSK (Phase Shift Keying). If multi-level CMA is used, the present invention can also be applied to a modulation mode such as QAM (Quadrature Amplitude Modulation). The present invention can obviously also be applied to cases of constant-modulus algorithms shown in Non-Patent Document 1 in which the output signal is a complex number.

Although a case focusing on CMA that takes an envelope as index was described in the present embodiment, the present invention clearly can also be applied in cases in which another statistic derived from the output signal is taken as index such as shown in Non-Patent Document 1.

The functions of the adaptive digital filter of the present invention can of course be realized by hardware through the use of separate parts such as ASIC (Application-Specific Integrated Circuits) or FPGA (Field Programmable Gate Arrays), and can also be realized by a program and computer such as a DPS (Digital Signal Processor). The program is provided recorded on a recording medium such as a magnetic disk or a semiconductor memory that can be read by a computer, is read by the computer at, for example, the time of starting up the computer, and controls the operations of the computer to cause the computer to function as the adaptive digital filter in the above-described embodiment.

Potential Utilization in Industry

As described hereinabove, the adaptive digital filter according to the present invention is useful as an adaptive digital filter that uses a CMA algorithm, and in particular, is suitable for use in a multipath equalizer of an FM receiver.

What is claimed is:

1. An adaptive digital filter comprising:
   a filter unit, implemented by at least one processor, that takes a complex signal as an input signal and that generates and outputs an output signal that is a complex signal generated by performing a convolution operation of the input signal and filter coefficients of a real signal; and
   a coefficient control unit, implemented by the at least one processor, that controls said filter coefficients based on an error between a target signal and an index value derived from said output signal,
   wherein said coefficient control unit includes:
   a common unit that generates and outputs a real signal that agrees with the error between said index value and said target signal; and
   a plurality of separate units provided for each multiplier for said convolution operation in said filter unit, the plurality of separate units calculating real filter coefficients to be used in a next sampling cycle based on: a signal obtained by converting a complex signal to a real number that is applied as an input to a corresponding multiplier, said real signal being received as an input from said common unit, and the current real filter coefficients.

2. The adaptive digital filter according to claim 1, wherein said filter unit takes as said input signal a complex signal in which one of two signals that have been generated from one real signal and that have phases that are shifted 90° with respect to each other is a real part and the other signal is an imaginary part.

3. The adaptive digital filter according to claim 1, wherein said coefficient control unit takes the value of the envelope of said output signal as said index value.

4. A signal processing method performed by at least one processor, the method comprising steps of:
   (a) taking a complex signal as an input signal and then supplying an output signal that is a complex signal generated by performing a convolution operation of the input signal and filter coefficients of a real signal; and
   (b) controlling said filter coefficients based on an error between a target signal and an index value derived from said output signal,
   wherein:
   said step (b) includes a common process for generating a real signal that agrees with the error between said index value and said target signal; and
   a plurality of separate processes that are carried out for each multiplier for said convolution operation in said step (a) for calculating real filter coefficients to be used in a next sampling cycle based on: a signal obtained by converting a complex signal to a real number that is applied as an input to the corresponding multiplier, said real signal being generated in said common process, and the current real filter coefficients.

5. The signal processing method according to claim 4, wherein, in said step (a), said input signal is a complex signal having one of two signals that are generated from one real signal and that have phases that are shifted 90° with respect to each other as a real part and the other signal as an imaginary part.

6. The signal processing method according to claim 4, wherein, in said step (b), the value of the envelope of said output signal is taken as said index value.

* * * * *